(12) United States Patent  (10) Patent No.: US 9,000,396 B2
Hill et al.  (45) Date of Patent: Apr. 7, 2015

(54) CHARGED PARTICLE DETECTORS

(75) Inventors: Raymond Hill, Rowley, MA (US);
Shawn McVey, Newton, NH (US); John Notte, IV, Gloucester, MA (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 543 days.

(21) Appl. No.: 13/277,658

(22) Filed: Oct. 20, 2011

(65) Prior Publication Data

US 2012/0068068 A1  Mar. 22, 2012

Related U.S. Application Data

(63) Continuation of application No. PCT/US2010/039304, filed on Jun. 21, 2010.

(60) Provisional application No. 61/219,826, filed on Jun. 24, 2009.

(51) Int. Cl.
*G01K 1/08* (2006.01)
*H01J 43/06* (2006.01)
*H01J 37/244* (2006.01)

(52) U.S. Cl.
CPC ............... *H01J 43/06* (2013.01); *H01J 37/244* (2013.01); *H01J 2237/2444* (2013.01); *H01J 2237/24455* (2013.01); *H01J 2237/2448* (2013.01); *H01J 2237/24495* (2013.01);
(Continued)

(58) Field of Classification Search
CPC ............ H01J 2237/2448; H01J 37/244; H01J 2237/2444; H01J 2237/24455; H01J 43/04; G01N 23/203; G01N 23/22

USPC .................. 250/306, 307, 310, 311, 397, 399
See application file for complete search history.

(56) References Cited

U.S. PATENT DOCUMENTS

| 4,588,891 A | 5/1986 | Saito |
| 6,720,557 B2 | 4/2004 | Frosien |
| 7,355,177 B2 | 4/2008 | Kamiya et al. |

(Continued)

FOREIGN PATENT DOCUMENTS

| DE | 60038007 T2 | 5/2008 |
| EP | 1160825 | 12/2001 |

(Continued)

OTHER PUBLICATIONS

European Office Action, European Application No. 10 726 403.8, 5 pages, dated Oct. 17, 2013.

(Continued)

*Primary Examiner* — Michael Maskell
(74) *Attorney, Agent, or Firm* — Fish & Richardson P.C.

(57) ABSTRACT

Disclosed are devices, systems, and methods are disclosed that include: (a) a first material layer positioned on a first surface of a support structure and configured to generate secondary electrons in response to incident charged particles that strike the first layer, the first layer including an aperture configured to permit a portion of the incident charged particles to pass through the aperture; and (b) a second material layer positioned on a second surface of the support structure and separated from the first layer by a distance of 0.5 cm or more, the second layer being configured to generate secondary electrons in response to charged particles that pass through the aperture and strike the second layer, where the device is a charged particle detector.

32 Claims, 9 Drawing Sheets

(52) U.S. Cl.
CPC ............... *H01J 2237/24564* (2013.01); *H01J 2237/24571* (2013.01); *H01J 2237/2802* (2013.01)

(56) References Cited

U.S. PATENT DOCUMENTS

| | | | | |
|---|---|---|---|---|
| 2003/0141450 | A1* | 7/2003 | Craven et al. | 250/310 |
| 2004/0227070 | A1* | 11/2004 | Bateman et al. | 250/287 |
| 2004/0238752 | A1 | 12/2004 | Tanba et al. | |
| 2004/0262531 | A1 | 12/2004 | Gerlach et al. | |
| 2004/0262533 | A1* | 12/2004 | Krueger | 250/397 |
| 2006/0163478 | A1 | 7/2006 | Jaksch et al. | |

FOREIGN PATENT DOCUMENTS

| | | |
|---|---|---|
| EP | 1 271 603 | 1/2003 |
| EP | 1271603 | 1/2003 |
| JP | S 51-21551 U | 2/1976 |
| JP | S 63-71680 | 4/1988 |
| JP | 6-139988 | 5/1994 |
| JP | 2002-033069 | 1/2002 |
| JP | 2002-083563 | 3/2002 |
| JP | 2007-165106 | 6/2007 |
| JP | 2008-282827 | 11/2008 |
| JP | 2009-009949 | 1/2009 |
| WO | WO 2007/067313 | 6/2007 |

OTHER PUBLICATIONS

The International Search Report and Written Opinion for corresponding PCT Application No. PCT/US2010/039304, dated Jan. 5, 2011.
The International Preliminary Report on Patentability for corresponding PCT Appl No. PCT/US2010/039304, dated Jan. 12, 2012.
Masaru Katoh, "Observation of STEM image using a secondary electron detector," Biomedical scanning electron microscope, Japan, 1982, 11, 15-16, with English translation.
Japanese Office Action, with translation thereof, for corresponding JP 2012-517620, dated Jan. 21, 2014.

* cited by examiner

CHARGED PARTICLE DETECTORS

CROSS-REFERENCE TO RELATED APPLICATIONS

This application is a continuation of, and claims priority under 35 U.S.C. §120, to international application PCT/US2010/039304, filed Jun. 21, 2010, which claims priority under 35 U.S.C. §119(e)(1) to U.S. Provisional Application No. 61/219,826, filed Jun. 24, 2009. The contents of both of these applications are hereby incorporated by reference in their entirety.

TECHNICAL FIELD

This disclosure relates to detection of charged particles.

BACKGROUND

Detectors such as Everhart-Thornley detectors can be used to measure charged particles such as secondary electrons and scattered ions that leave a surface of a sample that is exposed to a charged particle beam. When a thin sample is exposed to a charged particle beam, at least some of the incident charged particles can be transmitted through the sample.

SUMMARY

The detectors disclosed herein can be used to detect a variety of different charged particles. For example, in some embodiments, the detectors can be used to detect incident electrons that are transmitted through a sample. In certain embodiments, the detectors can be used to detect ions and/or neutral particles that are transmitted through a sample and/or emerge from a sample. In some embodiments, the detectors can be used to detect secondary electrons that emerge from surfaces of a sample. The surfaces can include the surface upon which a charged particle beam (e.g., an ion beam) is incident, and/or a surface opposite the incident surface.

The detectors disclosed herein produce a signal by converting some or all of the transmitted particles that are to be detected (e.g., ions, neutral particles, electrons) into a plurality of secondary electrons. On average, the number of generated secondary electrons per particle (e.g., the conversion factor) is determined by various factors including the secondary electron yield of a material used to form conversion surfaces in the detector. The conversion factor can be increased, for example, by fabricating conversion surfaces from materials that have higher secondary electron yields. In addition, the conversion factor can be increased by tilting conversion surfaces with respect to the direction of propagation of the transmitted particles.

The detectors disclosed herein are efficient, reliable, inexpensive, and can be used to obtain sample images that show various contrast mechanisms. Unlike some types of conventional ion detectors, the detectors disclosed herein generally do not saturate, and are not damaged by high transmitted charged particle currents. The detectors efficiently generate secondary electrons, which are readily detected using conventional detectors such as Everhart-Thornley detectors. As a result, the detectors disclosed herein can be combined with well-known particle detectors to create robust, efficient detection systems for transmitted charged particles.

The detectors disclosed herein can be used to generate images in which image intensity (e.g., grayscale intensity) at particular points (e.g., pixels) in the image is related to the detected signal at corresponding points on the sample. The detected signal at a particular sample location can vary according to characteristics of the sample at that location. Sample characteristics that can influence the detected signal (e.g., a magnitude of the detected signal) include, but are not limited to, the sample's thickness, crystalline structure, crystalline orientation, crystal defects, and elemental composition. By selecting a particular angular range of the detected particles, information corresponding to one or more of these sample characteristics can, in some embodiments, be enhanced in the measured sample images.

In general, in a first aspect, the disclosure features devices that include: (a) a first material layer positioned on a first surface of a support structure and configured to generate secondary electrons in response to incident charged particles that strike the first layer, the first layer including an aperture configured to permit a portion of the incident charged particles to pass through the aperture; and (b) a second material layer positioned on a second surface of the support structure and separated from the first layer by a distance of 0.5 cm or more, the second layer being configured to generate secondary electrons in response to charged particles that pass through the aperture and strike the second layer. The device is a charged particle detector.

In another aspect, the disclosure features devices that include: (a) first, second, and third material layers, each of the three layers being positioned on different surfaces of a support structure and spaced from one another along an axis, the first layer being oriented in a plane perpendicular to the axis and the second and third layers being oriented in planes inclined at an angle to the axis, the first layer including a first aperture and the second layer including a second aperture aligned with the first aperture along a direction parallel to the axis and having a maximum dimension smaller than a maximum dimension of the first aperture; (b) a first plurality of conductive wires extending in a plane parallel to the first layer, the first plurality of wires being positioned so that incident charged particles pass through the first plurality of wires before reaching the first layer, each member of the first plurality of wires being connected to a first electrical terminal; (c) a second plurality of conductive wires extending in a direction parallel to the axis and positioned along a portion of a circumference of the second layer, each member of the second plurality of conductive wires being connected to a second electrical terminal; and (d) a third plurality of conductive wires extending in a direction parallel to the axis and positioned along a portion of a circumference of the third layer, each member of the third plurality of conductive wires being connected to a third electrical terminal. The device is a charged particle detector.

In a further aspect, the disclosure features systems that include: (a) a support structure that includes a first surface and a second surface spaced from the first surface by 0.5 cm or more; (b) a first material layer disposed on the first surface, the first material layer being configured to generate secondary electrons when charged particles are incident on the first layer, and the first layer including an aperture positioned to permit a portion of the incident charged particles to pass through first layer; (c) a second material layer disposed on the second surface, the second material layer being configured to generate secondary electrons when charged particles that pass through the aperture are incident on the second layer; and (d) a detector configured to detect secondary electrons generated by one or more of the first and second layers.

In another aspect, the disclosure features methods that include: (a) directing charged particles from a sample to be incident on a first material layer positioned on a first surface of a support structure and including a first aperture; (b) directing transmitted charged particles that pass through the first aperture to be incident on a second material layer positioned on a second surface of the support structure and including a second aperture having a maximum dimension smaller than the first aperture; (c) directing transmitted charged particles that pass through the second aperture to be incident on a third material layer positioned on a third surface of the support structure; (d) applying electrical potentials to a first screen surrounding the first layer, a second screen surrounding the second layer, and a third screen surrounding the third layer to permit secondary electrons generated in one of the first, second, and third layers to reach a detector, and to reduce a likelihood that secondary electrons generated in the other layers reach the detector; (e) detecting the secondary electrons that reach the detector; and (f) forming an image of the sample based on the detected secondary electrons.

In a further aspect, the disclosure features methods that include separating a plurality of charged particles from a sample into a first plurality of particles and a second plurality of particles based on a scattering angle of each of the particles, directing each of the first and second pluralities of particles to be incident on different electron generating surfaces, and measuring a first signal corresponding to the first plurality of particles and a second signal corresponding to the second plurality of particles.

In another aspect, the disclosure features methods that include: (a) directing a first plurality of particles from a sample to be incident on a first surface, and measuring electrons generated by the first plurality of particles at the first surface, the first plurality of particles corresponding to scattering angles greater than two degrees; (b) directing a second plurality of particles from a sample to pass through an aperture formed in the first surface and to be incident on a second surface, and measuring electrons generated by the second plurality of particles at the second surface, the second plurality of particles corresponding to scattering angles less than two degrees; and (c) forming an image of the sample based on measured electrons corresponding to at least one of the first and second pluralities of particles.

In a further aspect, the disclosure features methods that include using a common detector to measure a first electronic signal corresponding to a first plurality of particles from a sample scattered within a first angular range leaving the sample, and a second electronic signal corresponding to a second plurality of particles from a sample scattered within a second angular range leaving the sample.

In another aspect, the disclosure features methods that include using a common detector to measure electronic signals corresponding to first and second pluralities of charged particles leaving a sample, where the first and second pluralities of charged particles correspond to different angular scattering ranges within the sample.

In a further aspect, the disclosure features methods that include generating a first plurality of electrons corresponding to a first plurality of charged particles leaving a sample by directing the first plurality of charged particles to strike a first surface of a detector, generating a second plurality of electrons corresponding to a second plurality of charged particles leaving a sample by directing the second plurality of charged particles to strike a second surface of the detector, and selectively detecting either the first plurality of electrons or the second plurality of electrons with a detector by applying a first electrical potential to a first screen positioned between the first surface and the detector, and applying a second electrical potential to a second screen positioned between the second surface and the detector.

In another aspect, the disclosure features methods that include spatially separating charged particles from a sample into a plurality of groups by directing the charged particles to be incident on one or more apertures, generating electronic signals corresponding to each of the groups by directing each group of particles to be incident on a different surface, each different surface being configured to generate secondary electrons when charged particles strike the surface, and selectively detecting the electronic signals corresponding to each of the groups using a common detector.

Embodiments can include one or more of the following features.

The device can include a third material layer positioned on a third surface of the support structure and configured to generate secondary electrons in response to charged particles that strike the third layer, the third layer including an aperture having a maximum dimension larger than a maximum dimension of the aperture in the first layer, the third layer being positioned to allow a portion of incident charged particles to pass through its aperture and reach the first layer. A geometric center of the aperture in the third layer can be positioned along an axis parallel to an average charged particle trajectory. A geometric center of the aperture in the first layer and a geometric center of the aperture in the third layer can be aligned along an axis parallel to an average charged particle trajectory.

The second layer can be oriented at an angle to an axis corresponding to an average charged particle trajectory. The first layer can be oriented normal to an axis corresponding to an average charged particle trajectory. A plane of the second layer can be oriented at an angle with respect to a plane of the first layer. The first and second layers can be oriented at an angle to an axis corresponding to an average charged particle trajectory. The third layer can be oriented normal to an axis corresponding to an average charged particle trajectory.

The first and second layers can be formed of a material having a secondary electron yield of 2.0 or more for incident He ions having an average energy of 25 keV at normal incidence. The first, second, and third layers can each be formed of a material having a secondary electron yield of 2.0 or more for incident He ions having an average energy of 25 keV at normal incidence. The first and second layers can be separated by a distance of 1.0 cm or more (e.g., 2.0 cm or more).

The device can include a plurality of conductive wires positioned along a circumference of at least a portion of the second layer, the plurality of wires extending above the second layer along a direction parallel to an average trajectory of the charged particles. The device can include a common electrical terminal connected to each of the plurality of wires extending above the second layer. The device can include a plurality of conductive wires extending in a plane perpendicular to an average trajectory of the charged particles so that the incident charged particles pass through the plane before reaching the first layer. The device can include a common electrical terminal connected to each of the plurality of wires extending in the plane parallel to the first layer.

The device can include: (a) a plurality of conductive wires positioned along a circumference of at least a portion of the second layer, the plurality of wires extending above the second layer along a direction parallel to an average trajectory of the charged particles; (b) a common electrical terminal connected to each of the plurality of wires extending above the second layer; (c) a plurality of conductive wires positioned along a circumference of at least a portion of the first layer, the plurality of wires extending above the first layer along a direction parallel to the direction of extent of the plurality of wires extending above the second layer; and (d) a common electrical terminal connected to each of the plurality of wires extending above the first layer. The device can include a plurality of conductive wires extending in a plane perpendicular to an average trajectory of the charged particles so that the incident charged particles pass through the plane before reaching the third layer, and a common electrical terminal connected to each of the plurality of wires extending in the plane perpendicular to the average trajectory of the charged particles.

The device can include a detecting device configured to detect secondary electrons generated by either or both of the first and second layers. The device can include a detecting device configured to detect secondary electrons generated by any of the first, second, and third layers.

The device can include an electronic processor coupled to the common electrical terminals connected to the pluralities of wires extending above the second layer and in the plane perpendicular to the average trajectory of the charged particles, the electronic processor being configured to apply different electrical potentials to each of the pluralities of wires. The device can include an electronic processor coupled to the common electrical terminals connected to the pluralities of wires extending above the first and second layers in the plane perpendicular to the average trajectory of the charged particles, the electronic processor being configured to apply different electrical potentials to each of the pluralities of wires.

Each of the first and second layers can include platinum. Each of the first, second, and third layers can include platinum. The first and second layers can be formed of different materials. At least two of the first, second, and third layers can be formed of different materials.

The device can include a translation mechanism connected to the support structure and configured to move the support structure into and out of a path of the incident charged particles.

The device can include a layer of material positioned on the first layer around a circumference of the aperture. The layer of material positioned around the circumference of the aperture can include a material having a secondary electron yield for incident He ions at an energy of 25 keV and normal incidence of 1.5 or less. The device can include layers of material positioned on the first and second layers around a circumference of each of the apertures in the first and second layers. The layers of material positioned around the circumferences of the apertures can include a material having a secondary electron yield for incident He ions at an energy of 25 keV and normal incidence of 1.5 or less.

The device can include a magnetic field source configured to collimate secondary electrons generated by any one or both of the first and second layers. The device can include a magnetic field source configured to collimate secondary electrons generated by one or more of the first, second, and third layers.

Each of the pluralities of conductive wires can be formed of a metal.

The device can include one or more additional material layers positioned between the first and second layers, each additional layer being configured to generate secondary electrons in response to incident charged particles that strike the layer, and each additional layer comprising an aperture having a maximum dimension larger than the maximum dimension of the aperture in the first layer, the aperture in each additional layer being positioned to allow a portion of incident charged particles to pass through the aperture and reach the first layer.

The angle can be 45 degrees or less. The first and second layers can each be oriented at angle of 45 degrees or less relative to the axis corresponding to an average charged particle trajectory.

The device can include an electronic processor configured to apply electrical potentials to each of the first, second, and third electrical terminals. The device can include a detecting device configured to detect secondary electrons generated by one or more of the first, second, and third layers when charged particles strike the one or more of the first, second, and third layers.

The second and third layers can be oriented at different angles relative to the axis.

The circumferential edges of the first and second apertures can include a layer of a material having a secondary electron yield for normally incident He ions at an energy of 25 keV of 1.5 or less. Each of the first, second, and third pluralities of conductive wires can be formed of a metal.

The system can include a first plurality of conducting wires extending in a plane parallel to a plane of the first material layer, where the first plurality of conducting wires are positioned so that the incident charged particles pass through the plane of the first plurality of wires before striking the first layer. The system can include a second plurality of conducting wires positioned along a portion of a circumference of the second layer and extending in a direction perpendicular to the plane of the first plurality of conducting wires. Each of the first plurality of conducting wires can be connected to a common first electrical contact, and each of the second plurality of conducting wires can be connected to a common second electrical contact. The system can include an electronic processor configured to apply different electrical potentials to each of the first and second contacts. An electrical potential difference between the first contact and an external ground has a sign that is opposite to an electrical potential difference between the second contact and the external ground.

The system can include a third material layer disposed on a third surface of the support structure between the first and second surfaces, the third layer comprising an aperture having a maximum dimension that is smaller than a maximum dimension of the aperture in the first layer, the third layer being configured to generate secondary electrons when charged particles that pass through the aperture in the first layer are incident on the third layer. Geometric centers of the apertures in the first and third layers can be aligned along a common axis so that a portion of incident charged particles pass through each of the first and third layers and are incident on the second layer. A plane of the second layer can be oriented at an angle to a plane of the first layer. Planes of the second layer and of the third layer can be oriented in a common direction relative to a plane of the first layer.

The first and second surfaces can be spaced by a distance of 1.0 cm or more (e.g., 2.0 cm or more).

The method can include applying an electrical potential that is positive relative to an external ground to permit secondary electrons to reach the detector, and applying an electrical potential that is negative relative to the external ground to prevent secondary electrons from reaching the detector. A magnitude of the positive electrical potential can be 500 V or less, and a magnitude of the negative electrical potential can be 500 V or less.

The method can include directing charged particles that correspond to each of the different regions of the sample to be incident on the first layer. The method can include directing charged particles to be incident on a sample from a charged particle source. The charged particle source can include a gas field ion source. The charged particles can include ions. The charged particles can include noble gas ions. The charged particles can include helium ions. The charged particles can include electrons.

The method can include applying an electrical potential that is positive relative to the external ground to the sample. The method can include forming the image based on detected secondary electrons from two or more of the first, second, and third layers.

The method can include determining an average grain size of a portion of the sample based on the image. The method can include determining whether a portion of a sample has a crystalline structure based on the image. The method can include determining a crystalline orientation of a portion of the sample based on the image. The method can include identifying variations in a thickness of the sample based on the image. The method can include determining a composition of the sample based on the image. The method can include identifying defects in the sample based on the image. The defects can include crystalline lattice imperfections. The defects can include dislocation loops.

Other features and advantages will be apparent from the description, drawings, and claims.

DESCRIPTION OF DRAWINGS

Like reference symbols in the various drawings indicate like elements.

DETAILED DESCRIPTION

Transmission microscopy can be used to reveal features and measure sample properties that complement and/or enhance measurements performed using other techniques such as detection of secondary electrons and/or scattered charged particles that leave sample surfaces on which charged particle beams are incident. Detection of transmitted charged particles can be difficult for various reasons: certain types of charged particle detectors (e.g., microchannel plates), when used to detect particles that are transmitted through samples, can be saturated or even damaged by the transmitted particles; some types of detectors (e.g., scintillators) which are less susceptible to damage can be relatively inefficient, resulting in reducing image resolution; and certain types of detectors (e.g., solid state detectors) can be relatively insensitive for low transmitted particle currents, and dark noise can dominate signals measured by such detectors. Other types of detectors can be expensive and/or can have operating requirements (e.g., active cooling) that can be inconvenient.

Figure 1:
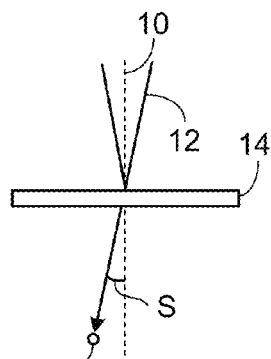
FIG. 1 is a schematic diagram showing scattering of incident ions that are transmitted through a sample.

Charged particles—which can include electrons and various types of ions (e.g., noble gas ions such as helium, neon, xenon, krypton)—can be scattered at a range of angles when transmitted through a sample. FIG. 1 shows a sample 14 that is exposed to a charged particle beam 12. An axis 10 corresponds to an average trajectory of charged particle beam 12. Transmitted charged particles are scattered at a range of angles as they pass through sample 14. For example, charged particle 16 is scattered at an angle s (e.g., the scattering angle of particle 16) relative to axis 10.

In transmission microscopy, measurement of populations of scattered particles as a function of the scattering angle s can yield important information about the nature of the sample. Sample images can be constructed in which pixel intensities are related to relative abundances of scattered particles within particular scattering angle ranges. Because the scattering angle depends upon a number of properties including the atomic numbers of sample atoms, the sample density, the sample crystalline orientation, and the sample thickness, angle-resolved or -binned measurements permit elucidation of some of these properties.

Brightfield transmission images are typically obtained based on detected transmitted particles that are scattered at relatively small angles as they pass through a sample. For example, in some embodiments, brightfield images correspond to scattered charged particles that are scattered at angles of 0.75 degrees or less (e.g., 0.70 degrees or less, 0.65 degrees or less, 0.60 degrees or less, 0.55 degrees or less, 0.50 degrees or less, 0.45 degrees or less, 0.40 degrees or less, 0.30 degrees or less, 0.20 degrees or less).

Darkfield transmission images are typically obtained based on detected transmitted particles that are scattered at larger angles than in brightfield images. For example, in certain embodiments, darkfield images correspond to scattered charged particles that are scattered at angles of 0.8 degree or more (e.g., 1.0 degree or more, 1.5 degrees or more, 2.0 degrees or more, 2.5 degrees or more, 3.0 degrees or more, 3.5 degrees or more) and/or 6.0 degrees or less (e.g., 5.5 degrees or less, 5.0 degrees or less, 4.5 degrees or less, 4.0 degrees or less).

High angular darkfield images are typically obtained based on detected transmitted particles that are scattered at larger angles than in darkfield images. For example, in some embodiments, high angular darkfield images correspond to scattered charged particles that are scattered at angles of 6.0 degrees or more (e.g., 7.0 degrees or more, 8.0 degrees or more, 10.0 degrees or more, 15.0 degrees or more, 20.0 degrees or more, 25.0 degrees or more, 30.0 degrees or more, 35.0 degrees or more, 40.0 degrees or more).

In practice, the angular ranges corresponding to different types of images can be found experimentally by detecting scattered particles within particular angular ranges, forming images based on the scattered particles, and comparing the images based on scattered particles at different angular ranges. Suitable angular ranges for brightfield, darkfield, and high angular darkfield images correspond, for example, to images that include different information (e.g., image features that have different intensities, or that appear in certain images but not others).

Figure 2:
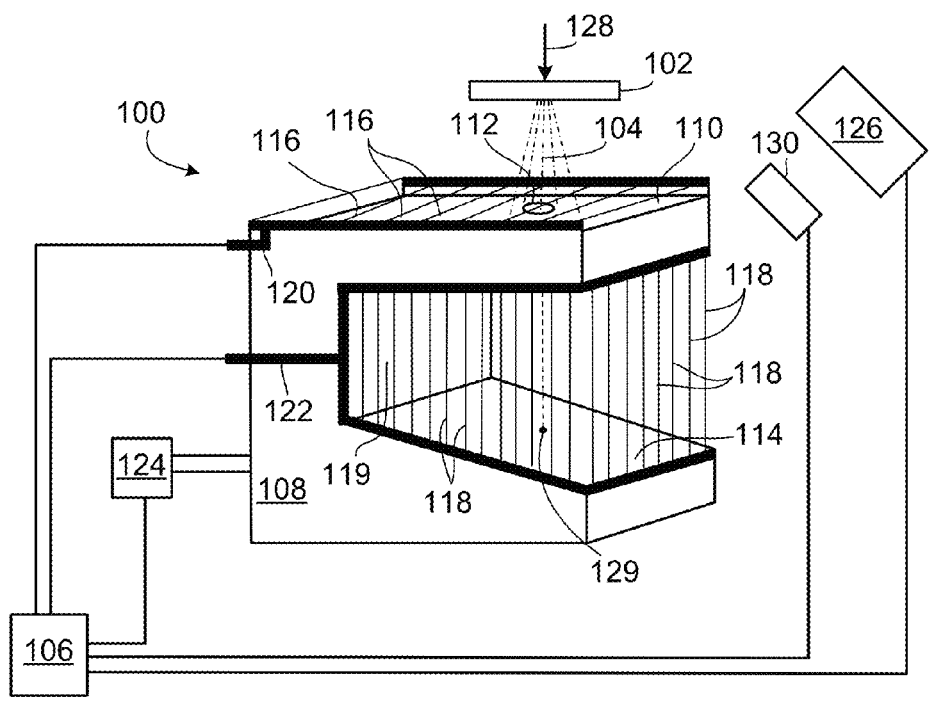
FIG. 2 is a schematic diagram of an embodiment of a detection system for transmitted charged particles.

FIG. 2 shows an embodiment of a charged particle detection system that can be used to measure scattered particles in transmission microscopy at a variety of different scattering angles. System 100 includes a support block 108 that supports material layers 110 and 114. Layers 110 and 114 are each formed of materials that generate secondary electrons when struck by particles such as electrons and/or ions and/or neutral particles. An aperture 112 is positioned in layer 110. A plurality of conducting wires 116 are positioned in a plane oriented perpendicular to an average trajectory of charged particle beam 128. Wires 116 are positioned between a sample 102 and layer 110. A second plurality of conducting wires 118 extend in a direction parallel to an average trajectory of charged particle beam 128, and are positioned around at least a portion of the circumference of layer 114. Conducting wires 116 are all connected to a common electrical contact 120, and conducting wires 118 are all connected to another common electrical contact 122. A translation mechanism 124 is coupled to block 108. A controller (e.g., an electronic processor) 106 is electrically connected to contacts 120 and 122, to translation mechanism 124, and to a detector 126 positioned to detect secondary electrons generated by layers 110 and 114.

During operation, sample 102 is exposed to a beam of charged particles 128. Charged particles 128 can include, for example, electrons and/or ions. A distribution of scattered charged particles 104 emerges from the opposite side of sample 102 at a range of different scattering angles. Block 108 is positioned so that aperture 112 coincides with a center of the distribution of scattered particles.

Aperture 112 is sized so that a portion of the distribution scattered particles 104 will pass through the aperture, and a portion of scattered particles 104 will not pass through the aperture. In general, particles that do not pass through aperture 112 are scattered at large angles relative to the axis defined by the average trajectory of charged particle beam 128. These scattered particles can correspond, for example, to darkfield and/or high angular darkfield particles. These scattered particles strike the surface of layer 110. Each particle that strikes layer 110 generates one or more secondary electrons that can be detected by detector 126.

Scattered particles that pass through aperture 112 strike layer 114 at position 129. These particles are scattered at smaller angles relative to the axis defined by the average trajectory of charged particle beam 128 and can correspond, for example, to brightfield particles. When each of these particles strikes layer 114, one or more secondary electrons are generated and can be detected by detector 126.

Aperture 112 therefore permits detection signals to be generated separately by small-angle and large-angle scattered particles 104. To separately detect signals corresponding to each of these different types of particles, different electrical potentials are applied to wires 116 and 118. For example, to detect signals corresponding to darkfield particles from layer 110, controller 106 applies a positive electrical potential (e.g., relative to an external ground) to wires 116, and a negative electrical potential to wires 118. The positive potential applied to wires 116 encourages secondary electrons generated in layer 110 to leave layer 110 and travel through wires 116 to detector 126. In contrast, the negative potential applied to wires 118 confines secondary electrons generated in layer 114 in a region surrounding layer 114 (e.g., discourages the secondary electrons from traveling through wires 118) where they are readsorbed onto layer 114, and therefore reduces and/or prevents detection of these secondary electrons by detector 126. To detect signals corresponding to brightfield particles from layer 114, controller 106 instead applies a positive electrical potential to wires 118 and a negative electrical potential to wires 106; these potentials promote escape and detection of secondary electrons generated in layer 114, and confinement of secondary electrons generated in layer 110. Thus, by adjusting the electrical potentials applied separately to wires 116 and 118, controller 106 can preferentially detect brightfield or darkfield particles with detector 126.

The secondary electron signal measured by detector 126—corresponding to either brightfield scattered particles, darkfield scattered particles, or a mixture thereof—can be used to form an image of sample 102. For example, the measured secondary electron signal can correspond to a pixel intensity in an image of the sample for a pixel that corresponds to the position of charged particle beam 128 on sample 102. By translating beam 128 to multiple locations on sample 102, pixel intensities at multiple sample positions can be measured and used to construct an image of sample 102. When multiple intensities are measured for each pixel (e.g., a first intensity corresponding to brightfield scattered particles and a second intensity corresponding to darkfield scattered particles), multiple sample images can be formed (e.g., a brightfield sample image and a darkfield sample image). Alternatively, or in addition, measured signals corresponding to different angular ranges of scattered particles, such as brightfield and darkfield signals, can be combined to produce a single image of sample 102.

Layers 110 and 114 can be formed from the same material or different materials, and are typically formed of materials that have a relatively high secondary electron yield. For example, in some embodiments, the secondary electron yield for the material used to form either or both of layers 110 and 114, for 25 keV He ions at normal incidence, can be 2.0 or more (e.g., 2.5 or more, 3.0 or more, 3.5 or more, 4.0 or more, 5.0 or more, 6.0 or more). Exemplary materials that can be used to form layers 110 and/or 114 include platinum. In some embodiments, it can be advantageous to use different materials to form layers 110 and 114 to adjust the magnitude of the different signals measured by detector 126 corresponding to different angular ranges of scattered particles.

Typically, layer 114 (and other similarly disposed layers) is inclined at an angle relative to the average trajectory of particle beam 128 to improve the yield of secondary electrons when scattered particles 104 strike layer 114 (e.g., relative to the secondary electron yield at normal incidence). For example, in some embodiments, an angle between a surface normal to layer 114 and the average trajectory of particle beam 128 is 5 degrees or more (e.g. 10 degrees or more, 15 degrees or more, 20 degrees or more, 25 degrees or more, 30 degrees or more) and/or 75 degrees or less (e.g., 70 degrees or less, 65 degrees or less, 60 degrees or less, 55 degrees or less, 50 degrees or less, 45 degrees or less).

In general, layer 114 is inclined at an angle with respect to layer 110. For example, in certain embodiments, an angle between a plane of layer 110 and a plane of layer 114 can be one degree or more (e.g., two degrees or more, three degrees or more, five degrees or more, 10 degrees or more, 15 degrees or more, 20 degrees or more, 25 degrees or more, 30 degrees or more, 40 degrees or more, 50 degrees or more) and/or 89 degrees or less (e.g., 85 degrees or less, 80 degrees or less, 75 degrees or less, 70 degrees or less, 60 degrees or less).

Typically, layer 114 is spaced from layer 110 along the direction of the average trajectory of particle beam 128. For example, in certain embodiments, a minimum spacing between layer 110 and layer 114 along the direction of the average trajectory of particle beam 128 is 0.5 cm or more (e.g., 1.0 cm or more, 1.5 cm or more, 2.0 cm or more, 2.5 cm or more, 3.0 cm or more, 4.0 cm or more, 5.0 cm or more, 6.0 cm or more, 7.0 cm or more) and/or 20 cm or less (e.g., 18 cm or less, 16 cm or less, 14 cm or less, 12 cm or less, 10 cm or less).

Each of layers 110 and 114 can have a variety of different shapes. For example, in FIG. 2, each of layers 110 and 114 has a square or rectangular shape. More generally, however, a variety of different shapes are possible, including regular shapes such as circular, elliptical, triangular, and other regular-sided polygonal shapes. Either or both of layers 110 and 114 can also have irregular shapes. Layers 110 and 114 can, in certain embodiments, have the same shape, or layers 110 and 114 can have different shapes.

Wires 116 and 118 are typically formed of conductive materials such as metals, and function as both screening and accelerating electrodes, depending upon the electrical potential applied to the wires. In FIG. 2, each of wires 116 is connected to a common electrical contact 120, and each of wires 118 is connected to a common electrical contact 122. More generally, however, wires 116 and/or wires 118 can be divided into multiple groups of wires, each of the groups being connected to a separate contacts. For example, each of the wires along a particular side of layer 114 can be connected to a common electrical contact, so that controller 106 can independently apply potentials along each of three different sides of layer 114. By applying potentials in this manner (e.g., by applying a positive potential to wires along one side of layer 114 and negative potentials to wires along the other sides of layer 114), controller 106 can encourage secondary electrons to emerge from a particular side of layer 114.

The magnitudes of the positive and negative potentials applied to wires 116 and 118 can vary as desired to promote escape of secondary electrons and confinement of secondary electrons, as appropriate. In some embodiments, for example, the magnitude of the electrical potential applied to wires 116 and/or 118 is 10 V or more (e.g., 20 V or more, 30 V or more, 40 V or more, 40 V or more, 50 V or more, 75 V or more, 100 V or more, 150 V or more) and/or 500 V or less (e.g., 450 V or less, 400 V or less, 350 V or less, 300 V or less, 250 V or less, 200 V or less).

In addition to wires 116 and 118 depicted in FIG. 2, other types of electrodes can also be used to perform the functions of the wires. For example, in some embodiments, either or both of wires 116 and 118 can be replaced by a conductive grid or mesh that includes a plurality of holes that allow secondary electrons to pass through the grid or mesh. The holes can have any of a wide variety of different shapes and sizes, depending upon the desired ease of secondary electron passage through the grid or mesh. In general, the larger the holes, the greater the ease with which secondary electrons will pass through the grid or mesh, and the lesser the confining ability of the grid or mesh.

Further, to either promote escape and detection of secondary electrons from layers 110 and 114 or to confine secondary electrons and prevent their detection, in some embodiments controller 106 can be connected to layers 110 and 114 and can apply electrical potentials to the layers. For example, controller 106 can apply a negative electrical potential (e.g., relative to an external ground) to layer 110 and/or 114 to promote escape of secondary electrons, and can apply a positive electrical potential to layer 110 and/or 114 to confine secondary electrons. The magnitudes of the potentials applied to layers 110 and 114 can, in general, be similar to the magnitudes of the potentials applied to wires 116 and 118.

To prevent detection by detector 126 of secondary electrons generated in sample 102 in response to incident charged particles 128, controller 106 can be configured in some embodiments to apply an electrical potential to sample 102. For example, controller 106 can apply a positive electrical potential (e.g., relative to an external ground) of sample 102 to make secondary electron escape from sample 102 more difficult. In general, the magnitude of the potential applied to sample 102 can be similar to the magnitudes of the potentials applied to wires 116 and 118.

A wide variety of different aperture shapes can be used. Typically, for example, aperture 112 is circular in shape. More generally, however, aperture 112 can be square, rectangular, elliptical, or another shape. Typically, the dimensions of aperture 112 are selected to control the angular range of scattered particles that generate signals on layers 110 and 114. By reducing the maximum dimension of aperture 112, for example, a larger number of scattered particles will strike layer 110 and will generate secondary electron signals therefrom, relative to the number of scattered particles that strike and generate secondary electron signals from layer 114. In FIG. 2, aperture 112 has a fixed size. More generally, however, in certain embodiments, aperture 112 can be adjustable, and can be adjusted to provide appropriate discrimination between brightfield and darkfield scattered particles 104. In some embodiments, for example, layer 110 can be configured to receive any of a range of apertures of different sizes; the differently-sized apertures can be removed and inserted into layer 110 as desired to change the scattered particle angular filtering properties of layer 110.

In some embodiments, the edges of aperture 112 can be coated with a layer of material with a relatively low secondary electron yield, to reduce and/or prevent the edges of the aperture from appearing as imaging artifacts in sample images. Typically, for example, the edges of aperture 112 can be coated with a material having a secondary electron yield, for He ions of energy 25 keV at normal incidence, of 1.5 or less (e.g., 1.4 or less, 1.3 or less, 1.2 or less, 1.1 or less, 1.0 or less, 0.9 or less, 0.8 or less). Exemplary materials that are suitable for coating the edges of aperture 112 include a variety of low atomic number materials such as carbon.

Translation mechanism 124 is coupled to controller 106 and permits movement of block 108 into and out of the path of scattered particles 104. Translation mechanism can include, for example, a motorized actuator coupled to a rotating shaft. Electronic signals from controller 106 direct mechanism 124 to move block 108 into to the path of particles 104 when layers 110 and 114 are to be used for scattered particle detection, and to withdraw block 108 from the path of particles 104 when other detectors are used for particle detection.

A particular advantage of system 100 is its compatibility with a wide variety of different types of detectors 126. Typically, for example, detector 126 is an Everhart-Thornley detector. However, other types of detectors can also be used, including microchannel plates, solid state detectors, and scintillators. Various types of suitable detectors are disclosed, for example, in U.S. Pat. No. 7,504,639, the entire contents of which are incorporated herein by reference.

In some embodiments, system 100 can include a magnetic field source 130. Magnetic field source 130 can be used to collimate secondary electrons generated by layers 110 and/or 114 for detection by detector 126. By collimating the secondary electrons, detection efficiency can, in some embodiments, be improved. Typically, the magnetic field generated by source 130 is adjusted so that the field does not significantly perturb the trajectories of scattered particles 104.

Figure 3:
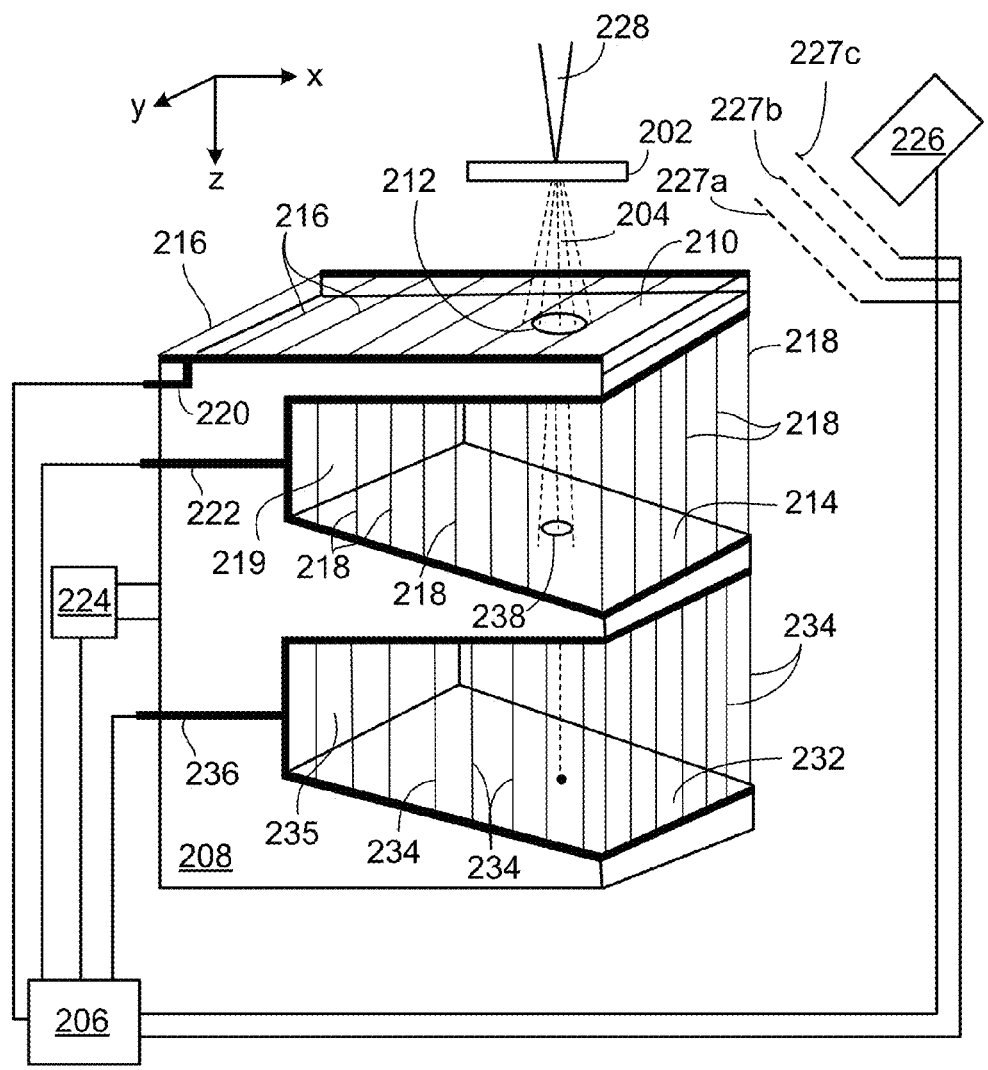
FIG. 3 is a schematic diagram of another embodiment of a detection system for transmitted charged particles.

In FIG. 2, two layers (e.g., layers 110 and 114) are used to detect scattered particles 104. More generally however, any number of layers (e.g., three layers, four layers, five layers, six layers, seven layers, or more than seven layers) can be used, together with progressively smaller apertures, to detect scattered particles corresponding to different scattering angular ranges. For example, FIG. 3 shows an embodiment of a system 200 that includes three different material layers 210, 214, and 232, each of which generates secondary electrons when struck by incident scattered particles. The orientation, composition, and configuration of layer 232 is similar to layer 114 disclosed above in connection with FIG. 2. System 200 also includes a controller 206 in communication with a translation mechanism 224 that is coupled to block 208. Controller 206 is also electrically coupled with each of electrical contacts 220, 222, and 236, which are connected to wires 216, 218, and 234, respectively. Detector 226, which is configured to detect secondary electrons generated by layers 210, 214, and 232, is also connected to controller 206.

Operation of system 200, and the function of the various components thereof, is similar to that of system 100 disclosed above. Sample 202 is exposed to charged particle beam 228, and a distribution of scattered particles 204 are transmitted through sample 202 at a range of scattering angles. Surface 210 includes an aperture 212, and surface 214 includes an aperture 238. Apertures 212 and 238 are aligned with one another along the direction of the average trajectory of charged particle beam 228. Further, a maximum dimension of aperture 212 is larger than a maximum dimension of aperture 238.

When scattered particles 204 are incident on layer 210, a portion of particles 204 (e.g., the particles scattered at relatively large scattering angles) strike layer 210 beyond the circumference of aperture 212, generating secondary electrons that can be detected by detector 226. The remaining particles 204 pass through aperture 212 and are incident on layer 214. A portion of particles 204 incident on layer 214 (e.g., particles scattered at intermediate scattering angles) strike layer 214 beyond the circumference of aperture 238, generating secondary electrons that can be detected by detector 226. The remaining particles 204 pass through aperture 238 and are incident on layer 232, where they strike layer 232 and generate secondary electrons that can be detected by detector 226.

Controller 206 can be configured in a manner similar to controller 106, as discussed above. Typically, for example, controller 206 can apply different electrical potentials to wires 216, 218, and 234 so that the secondary electron signal measured by detector 226 corresponds to a particular angular range of scattered particles 204. For example, by applying a positive electrical potential (e.g., relative to an external ground) to wires 218 and negative electrical potentials to wires 216 and 234, the secondary electron signal measured by detector 226 corresponds to particles 204 scattered at an intermediate range of angles upon transmission through sample 202. Secondary electron signals measured by detector 226 can be combined, for example, to generate images of sample 202 that correspond to multiple different angular ranges of scattered particles 204. Secondary electron signals measured by detector 226 can also be used to construct different images of sample 202, each of the different images corresponding to a different angular range of scattered particles 204. In some embodiments, for example, the different images can correspond to a brightfield image and/or a darkfield image and/or a high angular darkfield image, as disclosed herein.

In certain embodiments, combined signals can be measured by detector 226. For example, controller 206 can apply positive potentials to any two (or even all three) groups of wires 216, 218, and 234. As a result, the secondary electron signals measured by detector 226 can correspond to secondary electrons generated from more than one of layers 210, 214, and 232, and images formed of sample 202 can include information derived from multiple different angular ranges of scattered particles.

In some embodiments, multiple detectors can be used to acquire multiple signals at the same time. For example, referring to FIG. 2, instead of a single detector 126, the system can include two or more detectors. A first detector can be positioned in proximity to layer 114, and can be used to measure secondary electrons produced by layer 114 when brightfield particles are incident on layer 114. A second detector can be positioned in proximity to layer 110, and can be used to measure secondary electrons produced by layer 110 when darkfield particles are incident on layer 110. During operation, in some embodiments, only one of the two detectors may be actively detecting secondary electrons, while the other detector remains inactive. Alternatively, in certain embodiments, both of the detectors may be actively detecting particles at the same time. When both detectors are actively detecting particles, the system measures information corresponding to both brightfield (e.g., low scattering angle) and darkfield (e.g., high scattering angle) particles at the same time.

Similarly, referring to FIG. 3, in some embodiments, the system shown in FIG. 3 can include two detectors, three detectors, or even more than three detectors. For example, a first detector can be positioned proximal to layer 232, and can be configured to detect secondary electrons generated by layer 232. A second detector can be positioned proximal to layer 214, and can be configured to detect secondary electrons generated by layer 214. A third detector can be positioned proximal to layer 210, and can be configured to detect secondary electrons generated by layer 210. When any two or all three of the detectors are configured to actively detect secondary electrons, the system shown in FIG. 3 can acquire signals corresponding to different angular ranges of scattered particles at the same time.

In some embodiments, multiple detectors can be positioned and/or oriented differently with respect to the secondary electron-generating layers to improve the selectivity with which each detector measures secondary electrons generated by only a single one of the layers. For example, referring to FIG. 3, a first detector positioned proximal to layer 232 can be positioned so that it detects particles generated by layer 232 and propagating along the y direction. A second detector positioned proximal to layer 214 can be positioned so that it detects particles generated by layer 214 and propagating along the −y direction (e.g., the second detector can be positioned on a side of block 208 opposite to the side on which the first detector is positioned). A third detector can be positioned proximal to layer 210 and, for example, above layer 210 (e.g., displaced from layer 210 in the −z direction) to detect particles generated by layer 210. By positioning the multiple detectors in various locations around block 208, size restrictions on the detectors can be relaxed.

In certain embodiments, when detectors are positioned on a particular side of block 208, electrical potentials applied to the conductive wires positioned around the layers can be adjusted to preferentially direct generated secondary electrons in the direction of corresponding detectors. For example, when a first detector is positioned to detect particles generated by layer 232 and propagating in the y direction, different electrical potentials can be applied to some of the plurality of wires 234. Some or all of the plurality of wires 234 can be individually addressable by controller 206. As a result, controller 206 can be configured, for example, to apply a positive potential to the subset of wires 234 positioned between layer 232 and the first detector in the y direction. Controller 206 can also be configured to apply negative electrical potentials to the subsets of wires on the other two sides of layer 232. As a result, secondary electrons generated by layer 232 can be preferentially directed away from layer 232 along the y direction, toward the first detector. Similarly, where a second detector is positioned to detect secondary electrons generated by layer 214 and propagating along the −y direction, controller 206 can apply a positive electrical potential to a subset of the plurality of wires 218 between layer 214 and the second detector along the −y direction, and a negative electrical potential to the subsets of wires 218 on the other two sides of layer 214. As a result, secondary electrons generated by layer 214 are preferentially directed away from layer 214 along the −y direction to the second detector.

In general, any number of detectors can be used to measure secondary electrons generated by one or more of the various layers. In some embodiments, one detector can be configured to measure secondary electrons generated by two or more layers. In certain embodiments, one detector can be configured to measure secondary electrons generated by one layer. In some embodiments, multiple detectors can be configured to measure secondary electrons generated by one layer. The numbers, positions, and orientations of the one or more detectors can be selected as desired according to the imaging and multiplex requirements of particular methods. By using multiple detectors, secondary electron signals generated by one layer or by more than one layer (e.g., two or more layers, three or more layers, four or more layers, five or more layers) can be measured at the same time.

Further, in general, any of the pluralities of wires discussed herein can be connected to a controller (e.g., controllers 106 and/or 206) such that any one or more of the wires are individually addressable by the controllers. In some embodiments, for example, each of the pluralities of wires is connected to a common electrical contact, and the controller applies a common electrical potential to each of the wires. In certain embodiments, any of the pluralities of wires can be grouped into one or more subsets, where each subset is individually addressable by the controller. The controller can apply different electrical potentials to some or all of the subsets of wires. For example, in FIG. 3, the plurality of wires 234 surrounding layer 232 can be divided into three different subsets, each subset corresponding to wires positioned along one of the sides of layer 232. Controller 206 can be configured to apply the same potential to each of the different subsets of wires 234. Alternatively, as discussed above, controller 206 can be configured to apply different potentials to some of the subsets of wires, e.g., to direct secondary electrons generated by layer 232 to propagate along a particular direction. Similar configurations are also possible for the plurality of wires 218.

Moreover, in some embodiments, each member of any of the pluralities of wires disclosed herein can be individually addressable by a controller. The controller can generally be configured to apply any selected electrical potential to any one or more of the wires.

In certain embodiments, additional electrodes can be used to increase the efficiency with which secondary electrons generated by any of the layers are detected by the detectors. For example, in FIG. 2, surface 119 of block 108 can be coated with an electrically conductive material such as a metal, and can be electrically connected to controller 106. Controller 106 can be configured to apply an electrical potential to surface 119 to encourage secondary electrons to propagate away from layer 114 and toward detector 126. By applying a negative electrical potential to surface 119, for example, secondary electrons generated by layer 114 are repelled from surface 119. A positive electrical potential applied to wires 118 further encourages the generated secondary electrons to propagate away from layer 114 and toward detector 126. Similarly, in FIG. 3, surfaces 219 and/or 235 can be coated with a conductive material and electrically connected to controller 206. Controller 206 can apply positive electrical potentials (the same potential or different potentials) surfaces 219 and/or 235 to encourage secondary electrons to propagate away from layers 214 and 232, respectively, and toward detector 226.

Any of the embodiments disclosed herein can also include additional electrodes positioned to further improve the detection efficiency of secondary electrons generated by one or more of the various layers. In FIG. 3, three electrodes 227a-c can be positioned to further direct secondary electrons generated by any of layers 210, 214, and/or 232 toward detector 226. One or more electrodes can be positioned between each detector and the layer or layers generating secondary electrons that the detector is configured to detect. Typically, electrodes 227a-c are formed of a conductive material such as a metal, and are implemented as a wire grid or mesh that permits passage of secondary electrons. A controller (e.g., controller 206) typically applies a positive electrical potential to each of the electrodes (e.g., the same potential to each electrode, or different potentials to at least some or all of the electrodes). Secondary electrons are drawn to the electrodes, pass through the electrodes, and are incident on the detector. In some embodiments, where a plurality of electrodes are used in series, the magnitudes of the electrical potentials applied to successive electrodes (e.g., in the direction toward the detector from the layer(s) that generate the secondary electrons) can increase. Typically, electrical potentials applied to the electrodes have a magnitude of 10 V or more (e.g., 20 V or more, 30 V or more, 40 V or more, 50 V or more, 75 V or more, 100 V or more, 200 V or more, 300 V or more, 400 V or more, 500 V or more, 750 V or more, 1 kV or more) and/or 10 kV or less (e.g., 9 kV or less, 8 kV or less, 7 kV or less, 6 kV or less, 5 kV or less, 4 kV or less, 3 kV or less, 2 kV or less).

Measured signals and information corresponding to different angular ranges of scattered ions can be used to determine different types of information about a sample. Information that can be determined can include, for example, information about an elemental composition of the sample, information about the crystalline nature of the sample, information about a crystalline orientation of a portion of the sample, information about variations in a thickness of the sample, and information about defects in the sample (including crystalline lattice imperfections).

Figure 4:
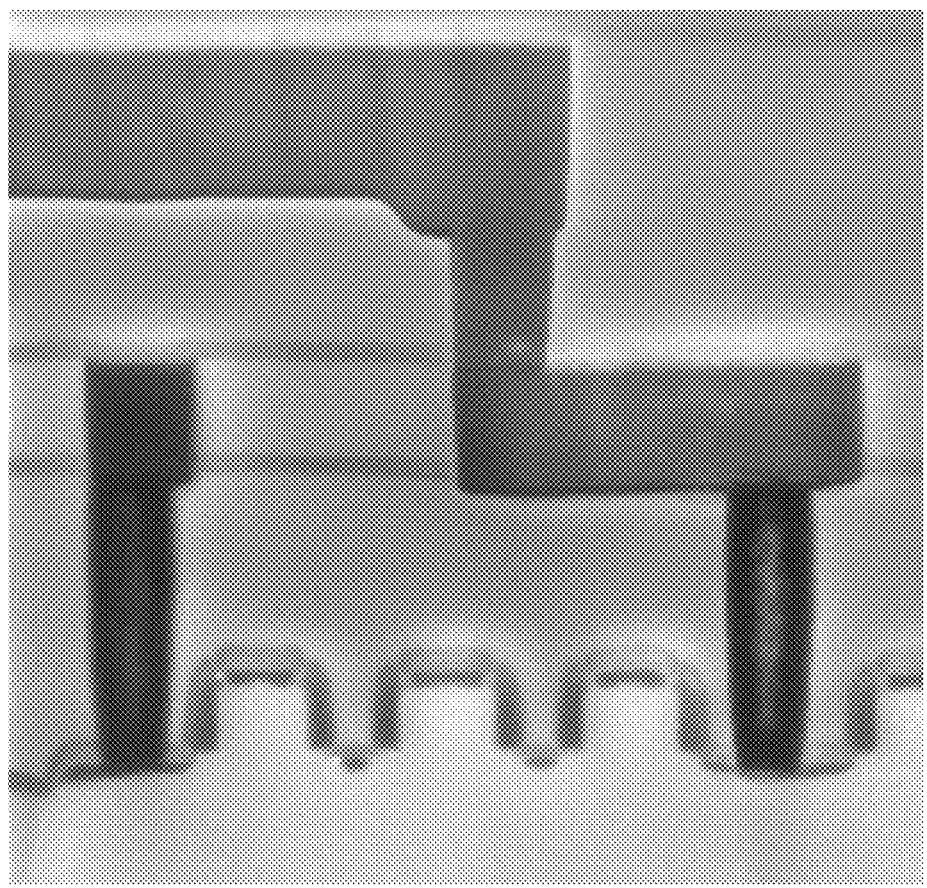
FIG. 4 is a brightfield transmission image of a sample showing image contrast due to different materials in the sample.

FIG. 4 shows a brightfield transmission image of a 100 nm thick semiconductor device. The image in FIG. 4 was obtained by exposing the device to incident He ions of average energy 30 keV and detecting brightfield transmitted ions. The dark regions of the image correspond to portions of the sample in which incident He ions were either stopped or scattered at large scattering angles. Lighter regions in the image correspond to portions of the sample where the incident He ions were not scattered, or were scattered at only relatively small angles. The dark regions in the image correspond to portions of the sample formed from tungsten. The lightest regions of the image correspond to portions of the sample formed from crystalline silicon. Image regions of intermediate intensity correspond to regions of the sample formed from copper, various dielectric materials, and metal oxides. Therefore, it is possible, based on such scattering-angle resolved transmission measurements, to distinguish components formed of different materials in a sample.

Figure 5:
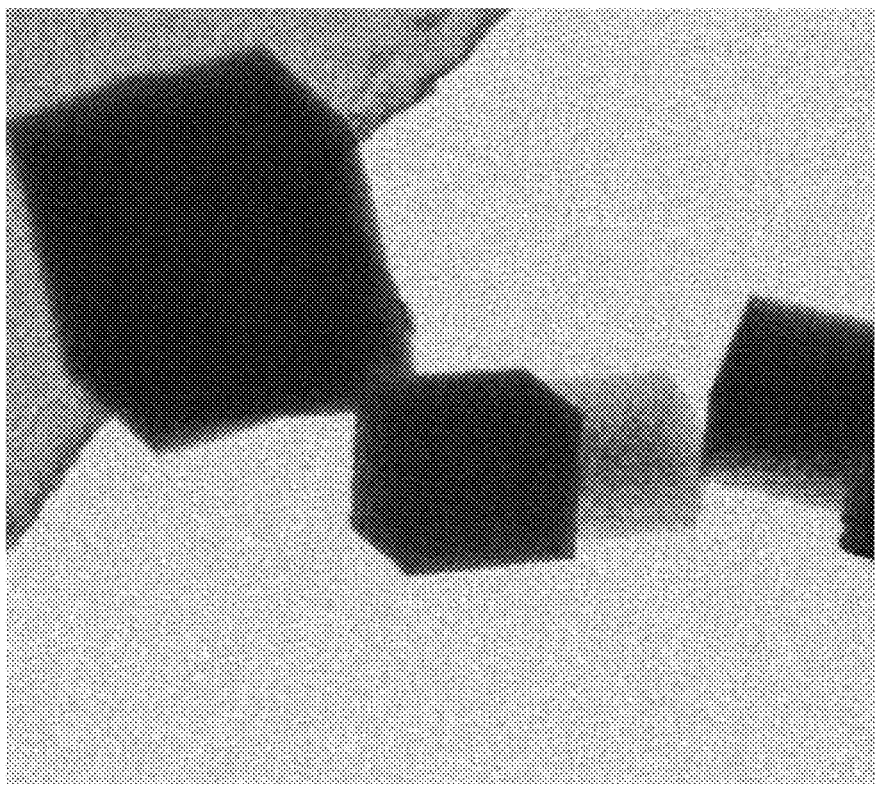
FIG. 5 is a brightfield transmission image of a sample showing portions of the sample oriented differently relative to one another.

FIG. 5 shows a brightfield transmission image of a sample that consists of a carbon support film (visible in the upper left corner of the image) upon which several magnesium oxide crystals are supported. The sample was exposed to He ions, and scattered ions within an angular scattering range of 0.5 degree through 2.0 degrees were detected and the detected signals used to form the image. As the image shows, the magnesium oxide crystals are approximately cubic in shape and oriented in different directions. For example, the left-most crystal in the image is oriented such that most of the incident He ions are either stopped within the crystal or scattered at angles larger than 2.0 degrees. However, the third crystal from the left is much brighter than the left-most crystal, and appears nearly transparent in the image. Apparently, this crystal is oriented such that most of the incident helium ions pass through the crystal either undeflected, or scattered at only small angles. It can be inferred from the image that atoms of this crystal are aligned along columns oriented approximately in the direction of propagation of the incident He ions, giving rise to a channeling effect. Thus, based on these types of scattering-angle resolved transmission measurements, it is possible to determine crystalline orientations of different portions of a sample.

Figure 6:
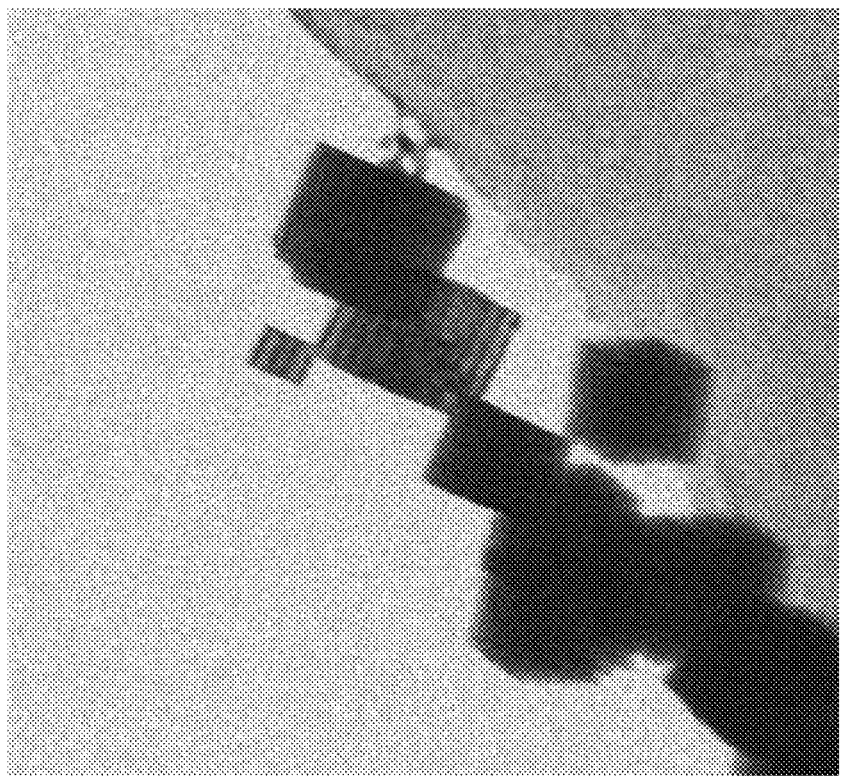
FIG. 6 is a brightfield transmission image of a sample showing thickness variations in different portions of the sample.

FIG. 6 shows a brightfield transmission image of a sample that is similar to the sample of FIG. 5: a carbon membrane supporting multiple magnesium oxide crystals. In FIG. 6, the sample was exposed to He ions, and scattered ions within an angular scattering range of 0.5 degree through 2.0 degrees were detected and the detected signals used to form the image. Two of the crystals in the image exhibit a striped intensity pattern. Based on this pattern, it is possible to infer that these crystals (like the nearly transparent crystal in FIG. 5) are oriented such that most of the incident He ions can pass through the crystals either undeflected, or scattered at relatively small angles. It is believed that the striped intensity pattern arises from an interference of the wave properties of the incident ions as they pass through various thicknesses of the crystal. The various trajectories of the ions, it is believed, result in either constructive or destructive interference of as the ion wave (e.g., comprising the incident ions) traverses regions in the sample of varying thickness. It is believed that the stripes are oriented parallel to contours of constant thickness in the sample. As a result, based on the scattering-angle resolved transmission measurements disclosed herein, it is possible to determine thickness variations in different portions of a sample.

Figure 7:
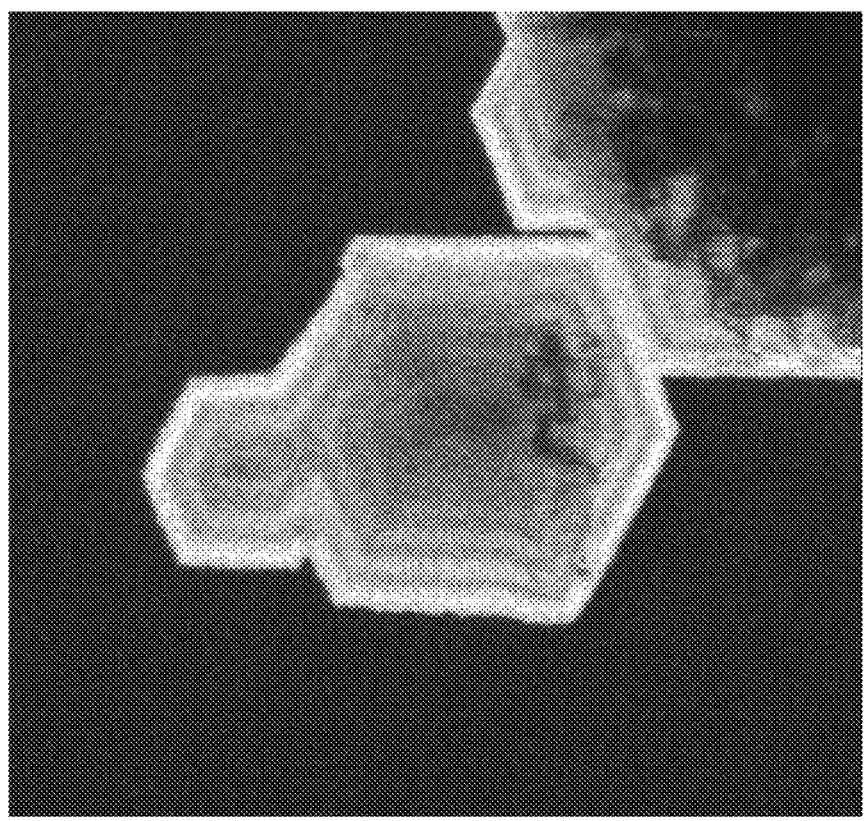
FIG. 7 is a darkfield transmission image of a sample showing sample defects.
Figure 8:
FIG. 8 is a brightfield transmission image of a sample showing sample defects.

FIG. 7 shows an image of a different portion of the same sample as in FIG. 6. In FIG. 7, the crystal in the center of the image is oriented such that a body diagonal of its cubic shape is aligned with the direction of incidence of the He ions. The crystal appears hexagonal in shape in FIG. 7, with striped thickness contours appearing as concentric hexagonal features. The image in FIG. 7 was acquired in darkfield mode, measuring He ions scattered at angles greater than 2.0 degrees. Thickness contours are visible in both brightfield and darkfield images of samples. Further, imperfections in the sample corresponding to lattice defects in the central magnesium oxide crystal are visible in the image. Accordingly, using the scattering-angle resolved transmission measurements disclosed herein, it is possible to identify sample defects such as lattice imperfections. FIG. 8 shows a brightfield image of another sample. In the image, the circled crystal is largely transparent to incident He ions, indicating that the He ions pass through the crystal undeflected or scattered at relatively small angles. However, dark string-like regions corresponding to lattice imperfections (e.g., dislocation loops) are visible in the crystal. Comparing FIGS. 7 and 8, it is evident that sample imperfections can be detected in both brightfield and darkfield imaging modes.

A variety of different sample properties can be determined qualitatively and/or quantitatively from images such as those shown in FIGS. 4-8. In some embodiments, for example, an average grain size in a region of a sample can be determine. One or more images of the sample can be obtained as discussed above, the images showing multiple different crystalline grains in a selected sample region. The one or more images can then be analyzed, e.g., using image analysis software operating on an electronic processor, to measure dimensions of one or more grains identified in the image(s). The dimensions of the grains, which can be measured in units of image pixels, can be converted to distance measurements (e.g., nanometers) by the electronic processor. Measurements of multiple different grain dimensions can be averaged to yield an average grain size measurement in a selected sample region.

In certain embodiments, sample images can be used to determine whether a selected region of a sample has a structure that is crystalline or amorphous. For example, a first sample image can be measured, and the selected region of the sample can be identified in the image. An average intensity of the selected region can be determined by calculating an average of pixel intensities within the selected region. Then, the sample can be tilted (or adjusted to a different tilt angle) with respect to the incident beam of charged particles, and one or more additional images of the sample can be obtained. The selected region of the sample can be identified in the one or more additional images, and the average pixel intensity in the selected region can be calculated from the additional image(s). If the average pixel intensity does not change significantly as the sample is tilted, the selected region of the sample can be identified as having an essentially amorphous structure. Conversely, if the average pixel intensity of the selected region does changed significantly as the sample is tilted, the selected region can be identified as having an essentially crystalline structure. By tilting a crystalline sample, the alignment of the ordered arrangement of atoms in the sample structure with respect to the direction of the incident charged particles changes, leading to variations in measured intensity. For an amorphous sample with significantly less structural order, the measured intensities corresponding to sample regions are considerably less dependent upon the orientation of the sample with respect to the incident charged particles.

In some embodiments, an elemental composition of a sample (or a portion thereof) can be determined based upon one or more sample images. As discussed above, the detectors disclosed herein can be used to measure signals corresponding to particles that emerge from a sample within a particular range of scattering angles. Typically, sample atoms of relatively small atomic number scatter incident particles at relatively small angles, while sample atoms of larger atomic number scatter incident particles at larger angles. By obtaining one or more sample images corresponding to particles that emerge within a range of small scattering angles, for example, elements of smaller atomic number in the sample can be identified. Samples images that correspond to particles that emerge within a range of larger scattering angles can similarly be used to identify larger atomic number elements in the sample. As an example, an image based on particles scattered at small angles can be used to identify low atomic number elements such as silicon in a sample, while an image based on particles scattered at larger angles can be used to identify larger atomic number elements such as tungsten in the sample. By selecting the angular range of the detected particles used to measure images of the sample, the presence of multiple different elements in the sample can be identified, and the distribution of the elements within the sample can be measured.

Typically, gas ion beams are produced in multipurpose microscope systems. Microscope systems that use a gas field ion source to generate ions that can be used in sample analysis (e.g., imaging) are referred to as gas field ion microscopes. A gas field ion source is a device that includes an tip (typically having an apex with 10 or fewer atoms) that can be used to ionize neutral gas species to generate ions (e.g., in the form of an ion beam) by bringing the neutral gas species into the vicinity of the tip (e.g., within a distance of about four to five angstroms) while applying a high positive potential (e.g., one kV or more relative to the extractor (see discussion below)) to the apex of the tip.

Figure 9:
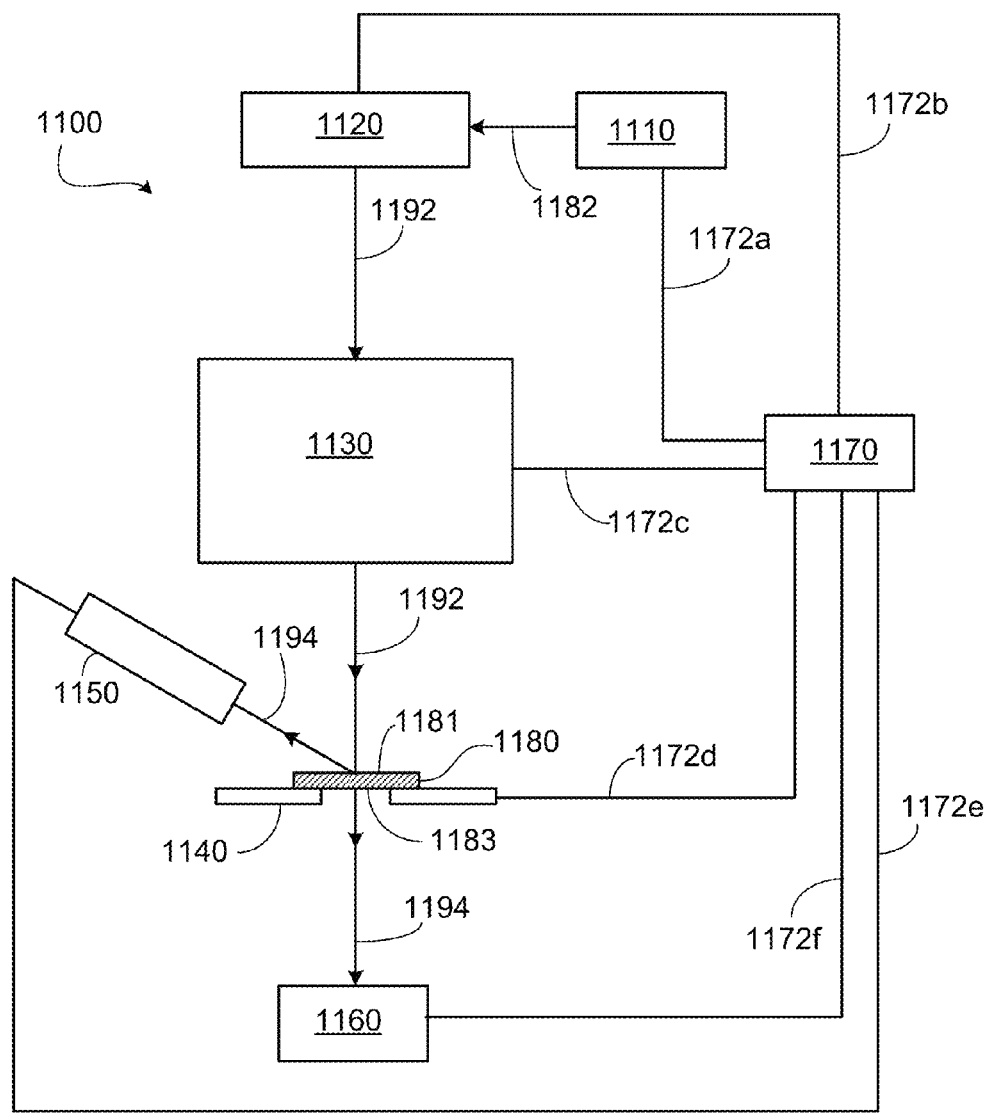
FIG. 9 is schematic diagram of an ion microscope system.

FIG. 9 shows a schematic diagram of a gas field ion microscope system 1100 that includes a gas source 1110, a gas field ion source 1120, ion optics 1130, a sample manipulator 1140, a front-side detector 1150, a back-side detector 1160, and an electronic control system 1170 (e.g., an electronic processor, such as a computer) electrically connected to various components of system 1100 via communication lines 1172a-1172f. A sample 1180 is positioned in/on sample manipulator 1140 between ion optics 1130 and detectors 1150, 1160. During use, an ion beam 1192 is directed through ion optics 1130 to a surface 1181 of sample 1180, and particles 1194 resulting from the interaction of ion beam 1192 with sample 1180 are measured by detectors 1150 and/or 1160.

In general, it is desirable to reduce the presence of certain undesirable chemical species in system 100 by evacuating the system. Typically, different components of system 1100 are maintained at different background pressures. For example, gas field ion source 1120 can be maintained at a pressure of approximately $10^{-10}$ Torr. When gas is introduced into gas field ion source 1120, the background pressure rises to approximately $10^{-5}$ Torr. Ion optics 1130 are maintained at a background pressure of approximately $10^{-8}$ Torr prior to the introduction of gas into gas field ion source 1120. When gas is introduced, the background pressure in ion optics 1130 typically increase to approximately $10^{-7}$ Torr. Sample 1180 is positioned within a chamber that is typically maintained at a background pressure of approximately $10^{-6}$ Torr. This pressure does not vary significantly due to the presence or absence of gas in gas field ion source 1120.

Figure 10:
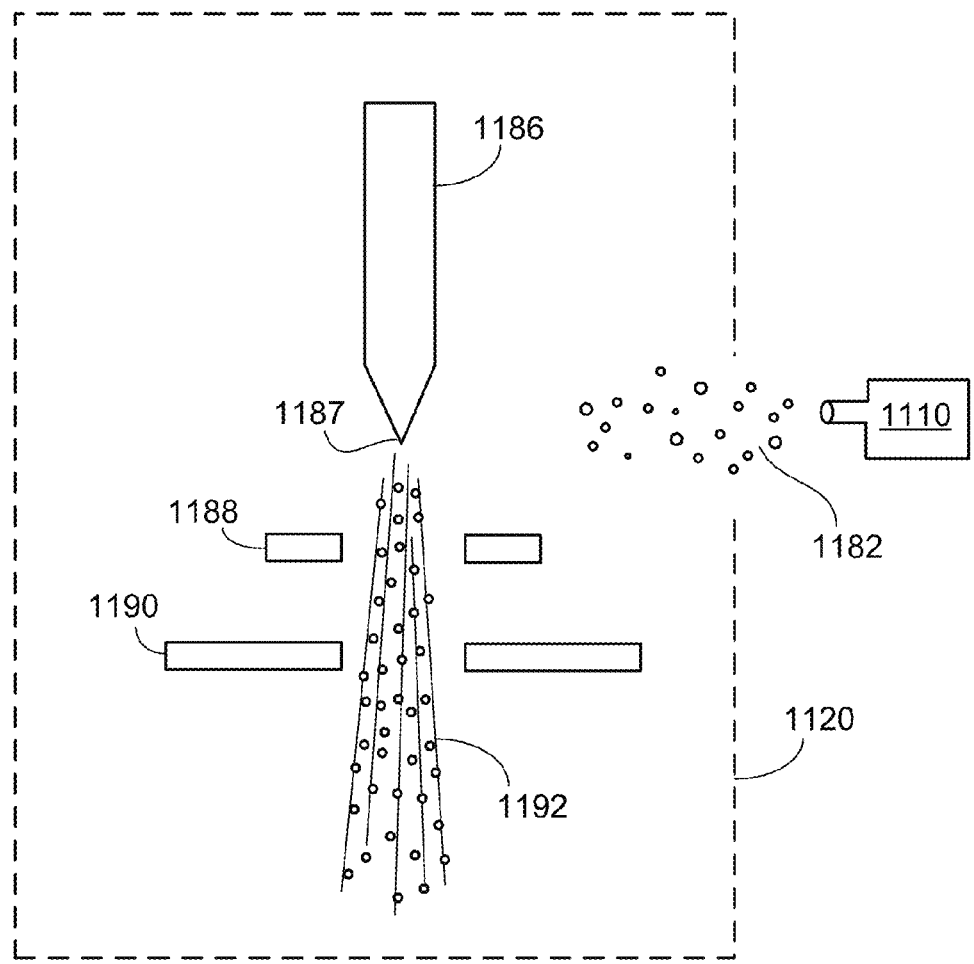
FIG. 10 is a schematic diagram of a gas field ion source.

As shown in FIG. 10, gas source 1110 is configured to supply one or more gases 1182 to gas field ion source 1120. As described in more detail below, gas source 1110 can be configured to supply the gas(es) at a variety of purities, flow rates, pressures, and temperatures. In general, at least one of the gases supplied by gas source 1110 is a noble gas (helium (He), neon (Ne), argon (Ar), krypton (Kr), xenon (Xe)), and ions of the noble gas are desirably the primary constituent in ion beam 1192. In general, as measured at surface 1181 of sample 1180, the current of ions in ion beam 1192 increases monotonically as the pressure of the noble gas in system 1100 increases. In certain embodiments, this relationship can be described by a power law where, for a certain range of noble gas pressures, the current increases generally in proportion to gas pressure. During operation, the pressure of the noble gas is typically $10^{-2}$ Torr or less (e.g., $10^{-3}$ Torr or less, $10^{-4}$ Torr or less), and/or $10^{-7}$ Torr or more (e.g., $10^{-6}$ Torr or more, $10^{-5}$ Torr or more) adjacent the tip apex (see discussion below). In general, it is desirable to use relatively high purity gases (e.g., to reduce the presence of undesirable chemical species in the system). As an example, when He is used, the He can be at least 99.99% pure (e.g., 99.995% pure, 99.999% pure, 99.9995% pure, 99.9999% pure). Similarly, when other noble gases are used (Ne gas, Ar gas, Kr gas, Xe gas), the purity of the gases is desirably high purity commercial grade.

Optionally, gas source 1110 can supply one or more gases in addition to the noble gas(es). As discussed in more detail below, an example of such a gas is nitrogen. Typically, while the additional gas(es) can be present at levels above the level of impurities in the noble gas(es), the additional gas(es) still constitute minority components of the overall gas mixture introduced by gas source 1110. As an example, in embodiments in which He gas and Ne gas are introduced by gas source 1110 into gas field ion source 1120, the overall gas mixture can include 20% or less (e.g., 15% or less, 12% or less) Ne, and/or 1% or more (e.g., 3% or more, 8% or more) Ne. For example, in embodiments in which He gas and Ne gas are introduced by gas source 110, the overall gas mixture can include from 5% to 15% (e.g., from 8% to 12%, from 9% to 11%) Ne. As another example, in embodiments in which He gas and nitrogen gas are introduced by gas source 1110, the overall gas mixture can include 1% or less (e.g., 0.5% or less, 0.1% or less) nitrogen, and/or 0.01% or more (e.g., 0.05% or more) nitrogen. For example, in embodiments in which He gas and nitrogen gas are introduced by gas source 1110, the overall gas mixture can include from 0.01% to 1% (e.g., from 0.05% to 0.5%, from 0.08 to 0.12%) nitrogen. In some embodiments, the additional gas(es) are mixed with the noble gas(es) before entering system 1100 (e.g., via the use of a gas manifold that mixes the gases and then delivers the mixture into system 1100 through a single inlet). In certain embodiments, the additional gas(es) are not mixed with the noble gas(es) before entering system 1100 (e.g., a separate inlet is used for inputting each gas into system 1100, but the separate inlets are sufficiently close that the gases become mixed before interacting with any of the elements in gas field ion source 1120).

Gas field ion source 1120 is configured to receive the one or more gases 1182 from gas source 1110 and to produce gas ions from gas(es) 1182. Gas field ion source 1120 includes a tip 1186 with a tip apex 1187, an extractor 1190 and optionally a suppressor 1188. Typically, the distance from tip apex 1187 to surface 1181 of sample 1180 (not shown in FIG. 10) is five cm or more (e.g., 10 cm or more, 15 cm or more, 20 cm or more, 25 cm or more), and/or 100 cm or less (e.g., 80 cm or less, 60 cm or less, 50 cm or less). For example, in some embodiments, the distance from tip apex 1187 to surface 1181 of sample 1180 is from five cm to 100 cm (e.g., from 25 cm to 75 cm, from 40 cm to 60 cm, from 45 cm to 55 cm).

Tip 1186 can be formed of various materials. In some embodiments, tip 1186 is formed of a metal (e.g., tungsten (W), tantalum (Ta), iridium (Ir), rhenium (Rh), niobium (Nb), platinum (Pt), molybdenum (Mo)). In certain embodiments, tip 1186 can be formed of an alloy. In some embodiments, tip 1186 can be formed of a different material (e.g., carbon (C)).

During use, tip 1186 is biased positively (e.g., approximately 20 kV) with respect to extractor 1190, extractor 1190 is negatively or positively biased (e.g., from −20 kV to +50 kV) with respect to an external ground, and optional suppressor 1188 is biased positively or negatively (e.g., from −5 kV to +5 kV) with respect to tip 1186. Because tip 1186 is formed of an electrically conductive material, the electric field of tip 1186 at tip apex 1187 points outward from the surface of tip apex 1187. Due to the shape of tip 1186, the electric field is strongest in the vicinity of tip apex 1187. The strength of the electric field of tip 1186 can be adjusted, for example, by changing the positive voltage applied to tip 1186. With this configuration, un-ionized gas atoms 1182 supplied by gas source 1110 are ionized and become positively-charged ions in the vicinity of tip apex 1187. The positively-charged ions are simultaneously repelled by positively charged tip 1186 and attracted by negatively charged extractor 1190 such that the positively-charged ions are directed from tip 1186 into ion optics 1130 as ion beam 1192. Suppressor 1188 assists in controlling the overall electric field between tip 1186 and extractor 1190 and, therefore, the trajectories of the positively-charged ions from tip 1186 to ion optics 1130. In general, the overall electric field between tip 1186 and extractor 1190 can be adjusted to control the rate at which positively-charged ions are produced at tip apex 1187, and the efficiency with which the positively-charged ions are transported from tip 1186 to ion optics 1130.

As an example, without wishing to be bound by theory, it is believed that He ions can be produced as follows. Gas field ion source 1120 is configured so that the electric field of tip 1186 in the vicinity of tip apex 1187 exceeds the ionization field of the un-ionized He gas atoms 1182, and tip 1186 is maintained at a relatively low temperature. When the un-ionized He gas atoms 1182 are in close proximity to tip apex 1187, the He atoms can be polarized by the electric field of the tip, producing a weakly attractive force between He atoms 1182 and tip apex 1187. As a result, He atoms 1182 may contact tip apex 1187 and remain bound (e.g., physisorbed) thereto for some time. In the vicinity of tip apex 1187, the electric field is high enough to ionize He atoms 1182 adsorbed onto tip apex 1187, generating positively charged He ions (e.g., in the form of an ion beam).

In general, ion optics 1130 are configured to direct ion beam 1192 onto surface 1181 of sample 1180. As described in more detail below, ion optics 1130 can, for example, focus, collimate, deflect, accelerate, and/or decelerate ions in beam 1192. Ion optics 1130 can also allow only a portion of the ions in ion beam 1192 to pass through ion optics 1130. Generally, ion optics 1130 include a variety of electrostatic and other ion optical elements that are configured as desired. By manipulating the electric field strengths of one or more components (e.g., electrostatic deflectors) in ion optics 1130, He ion beam 1192 can be scanned across surface 1181 of sample 1180. For example, ion optics 1130 can include two deflectors that deflect ion beam 1192 in two orthogonal directions. The deflectors can have varying electric field strengths such that ion beam 1192 is rastered across a region of surface 1181.

When ion beam 1192 impinges on sample 1180, a variety of different types of particles 1194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 1150 and 1160 are positioned and configured to each measure one or more different types of particles resulting from the interaction between He ion beam 1192 and sample 1180. As shown in FIG. 9, detector 1150 is positioned to detect particles 1194 that originate primarily from surface 1181 of sample 1180, and detector 1160 is positioned to detect particles 1194 that emerge primarily from surface 1183 of sample 1180 (e.g., transmitted particles). In some embodiments, detector 1160 can correspond to any of the detection systems disclosed herein for detecting charged particles that are transmitted through sample 1180.

In general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of a given particle). Optionally, combinations of such detector arrangements can be used.

In general, the information measured by the detectors is used to determine information about sample 1180. Typically, this information is determined by obtaining one or more images of sample 1180. By rastering ion beam 1192 across surface 1181, pixel-by-pixel information about sample 1180 can be obtained in discrete steps. Detectors 1150 and/or 1160 can be configured to detect one or more different types of particles 1194 at each pixel. Typically, a pixel is a square, although in some embodiments, pixels can have different shapes (e.g., rectangular). A pixel size, which corresponds to a length of a side of the pixel, can be, for example, from 100 pm to two μm (e.g., from one nm to one μm). In some embodiments, the location of adjacent pixels can be determined to within at least 200 pm (e.g., to within at least 100 pm, to within at least 75 pm, to within at least 50 pm). Thus, the operator of the system can determine the location of the center of the beam spot to within at least 200 pm (e.g., to within at least 100 pm, to within at least 75 pm, to within at least 50 pm). In certain embodiments, the field of view (FOV) of sample 1180 is 200 nm or more (e.g., 500 nm or more, 1 μm or more, 50 μm or more, 100 μm or more, 500 μm or more, 1 mm or more, 1.5 mm or more), and/or 25 mm or less (15 mm or less, 10 mm or less, five mm or less). The field of view refers to the area of a sample surface that is imaged by the ion microscope.

The operation of microscope system 1100 is typically controlled via electronic control system 1170. For example, electronic control system 1170 can be configured to control the gas(es) supplied by gas source 1110, the temperature of tip 1186, the electrical potential of tip 1186, the electrical potential of extractor 1190, the electrical potential of suppressor 1188, the settings of the components of ion optics 1130, the position of sample manipulator 1140, and/or the location and settings of detectors 1150 and 1160. In some embodiments, for example, electronic control system 1170 can be connected and can perform some or all of the functions disclosed above in connection with controllers 106 and/or 206.

Optionally, one or more of these parameters may be manually controlled (e.g., via a user interface integral with electronic control system 1170). Additionally or alternatively, electronic control system 1170 can be used (e.g., via an electronic processor, such as a computer) to analyze the information collected by detectors 1150 and 1160 and to provide information about sample 1180 (e.g., topography information, material constituent information, crystalline information, voltage contrast information, optical property information, magnetic information), which can optionally be in the form of an image, a graph, a table, a spreadsheet, or the like. Typically, electronic control system 1170 includes a user interface that features a display or other kind of output device, an input device, and a storage medium.

Detectors 1150 and 1160 are depicted schematically in FIG. 9, with detector 1150 positioned to detect particles from surface 1181 of sample 1180 (the surface on which the ion beam impinges), and detector 1160 positioned to detect particles from surface 1183 of sample 1180. In general, a wide variety of different detectors can be employed in microscope system 1100 to detect different particles, and a microscope system 1100 can typically include any desired number of detectors. The configuration of the various detector(s) can be selected in accordance with particles to be measured and the measurement conditions. In some embodiments, a spectrally resolved detector may be used. Such detectors are capable of detecting particles of different energy and/or wavelength, and resolving the particles based on the energy and/or wavelength of each detected particles. In certain embodiments, a spectrally resolved detector includes components capable of directing particles to different regions of the detector based on the energy and/or wavelength of the particle.

In general, detectors 1150 and/or 1160 can include any one or more of the following detector types: Everhart-Thornley (ET) detectors, which can be used to detect secondary electrons, ions, and/or neutral particles; microchannel plate detectors, which can be used to amplify a flux of secondary electrons, neutral atoms, or ions from a sample; conversion plates, which can be used to detect ions (e.g., scattered ions, secondary ions) from a sample or neutral particles (e.g., primary neutral He atoms) from the sample; channeltron detectors, which can be used to detect particles such as electrons, ions and neutral atoms leaving a sample; phosphor-based detectors, which include a thin layer of a phosphor material deposited atop a transparent substrate, and a photon detector such as a CCD camera, a PMT, or one or more diodes, and which can be used to detect electrons, ions and/or neutral particles from a sample; solid state detectors, which can be used to detect secondary electrons, ions, and/or neutral atoms from a sample; scintillator-based detectors, which include a scintillator material that generates photons in response to being struck by an incident particle (electron, ion, or neutral atom), which can be particularly useful for energy measurements of particles; electrostatic and magnetic prism detectors for ions and electrons; quadrupole detectors for ions; biased particle selectors for ions and electrons; time-of-flight detectors for secondary electrons, ions, and neutral atoms; and angle-resolving detectors that can measure angle-dependent scattering information for ions, electrons, and neutral atoms.

Computer Hardware and Software

In general, any of the methods described above can be implemented in computer hardware or software, or a combination of both. The methods can be implemented in computer programs using standard programming techniques following the methods and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The methods can also be implemented as a computer-readable storage medium, configured with a computer program, where the storage medium so configured causes a computer to operate in a specific and predefined manner to perform the functions described herein.

Other Embodiments

Other embodiments are in the claims.

What is claimed is:

1. A device, comprising:
a first material layer positioned on a first surface of a support structure and configured to generate secondary electrons in response to incident charged particles that strike the first layer, the first layer comprising an aperture configured to permit a portion of the incident charged particles to pass through the aperture;
a second material layer positioned on a second surface of the support structure and separated from the first layer by a distance of 0.5 cm or more, the second layer being configured to generate secondary electrons in response to the portion of the charged particles that pass through the aperture in the first layer and strike the second layer;
a detector configured to detect secondary electrons generated by both the first and second layers; and
a member positioned along a circumference of at least a portion of the second layer, the member extending above the second layer along a direction parallel to an average trajectory of the charged particles that pass through the aperture and strike the second layer,
wherein:
the member comprises a member selected from the group consisting of a first plurality of conductive wires, a conductive grid, and a mesh comprising holes that allow secondary electrons to pass therethrough; and
the device is a charged particle detector.

2. The device of claim 1, wherein a geometric center of the aperture in the first layer is positioned along an axis parallel to an average charged particle trajectory of the incident charged particles that strike the first layer.

3. The device of claim 1, wherein the second layer is oriented inclined relative to the first layer.

4. The device of claim 1, wherein the first layer is oriented normal to an axis corresponding to an average charged particle trajectory.

5. The device of claim 1, wherein the first and second layers are oriented at an angle to an axis corresponding to an average charged particle trajectory of the incident charged particles that strike the first layer.

6. The device of claim 1, wherein the first and second layers are formed of a material having a secondary electron yield of 2.0 or more for incident He ions having an average energy of 25 keV at normal incidence.

7. The device of claim 1, wherein the member comprises the first plurality of conductive wires.

8. The device of claim 7, further comprising a second plurality of conductive wires extending in a plane perpendicular to an average trajectory of the charged particles that pass through the aperture and strike the second layer so that the incident charged particles pass through the plane before reaching the first layer.

9. The device of claim 8, further comprising an electronic processor coupled to the first and the second pluralities of wires, the electronic processor being configured to apply different electrical potentials to each of the first and the second pluralities of wires.

10. The device of claim 1, wherein the first and second layers are formed of different materials.

11. The device of claim 1, further comprising a translation mechanism connected to the support structure and configured to move the support structure into and out of a path of the incident charged particles.

12. The device of claim 1, further comprising a layer of material positioned on the first layer around a circumference of the aperture, wherein the layer of material positioned around the circumference of the aperture comprises a material having a secondary electron yield smaller than the first layer for incident He ions at an energy of 25 keV and normal incidence.

13. The device of claim 1, further comprising a magnetic field source configured to collimate secondary electrons generated by any one or both of the first and second layers.

14. The device of claim 1, further comprising one or more additional material layers positioned between the first and second layers, each additional layer being configured to generate secondary electrons in response to incident charged particles that strike the layer, and each additional layer comprising an aperture having a maximum dimension larger than the maximum dimension of the aperture in the first layer, the aperture in each additional layer being positioned to allow a portion of incident charged particles to pass through the aperture and reach the second layer.

15. The device of claim 1, further comprising:
a charged particle beam system comprising:
a charged particle source;
charged particle optics, the charged particle source and charged particle optics being configured to provide and form a charged particle beam having an average charged particle trajectory; and
a sample stage being positioned between the charged particle source and the first layer.

16. A device, comprising:
first, second, and third material layers, each of the three layers being positioned on different surfaces of a support structure and spaced from one another along an axis, the first layer being oriented in a plane perpendicular to the axis and the second and third layers being oriented in planes inclined at an angle to the axis, the first layer comprising a first aperture and the second layer comprising a second aperture aligned with the first aperture along a direction parallel to the axis and having a maximum dimension smaller than a maximum dimension of the first aperture;
a first plurality of conductive wires extending in a plane parallel to the first layer, the first plurality of wires being positioned so that incident charged particles pass through the first plurality of wires before reaching the first layer, each member of the first plurality of wires being connected to a first electrical terminal;
a second plurality of conductive wires extending in a direction parallel to the axis and positioned along a portion of a circumference of the second layer, each member of the second plurality of conductive wires being connected to a second electrical terminal; and
a third plurality of conductive wires extending in a direction parallel to the axis and positioned along a portion of a circumference of the third layer, each member of the third plurality of conductive wires being connected to a third electrical terminal,
an electronic processor configured to apply electrical potentials to each of the first, second, and third electrical terminals; and
a detecting device configured to detect secondary electrons generated by one or more of the first, second, and third layers when charged particles strike the one or more of the first, second, and third layers.

17. The device of claim 16, wherein the first, second, and third layers are each formed of a material having a secondary electron yield for normally incident He ions at an energy of 25 keV of 2.0 or more.

18. The device of claim 17, wherein the second and third layers are oriented at different angles relative to the axis.

19. The device of claim 17, wherein circumferential edges of the first and second apertures comprise a layer of a material having a secondary electron yield for normally incident He ions at an energy of 25 keV smaller that the secondary electron yield of the first, second and third layer.

20. A method, comprising:
directing charged particles from a sample to be incident on a first material layer positioned on a first surface of a support structure and comprising a first aperture;
directing transmitted charged particles that pass through the first aperture to be incident on a second material layer positioned on a second surface of the support structure and comprising a second aperture having a maximum dimension smaller than the first aperture;
directing transmitted charged particles that pass through the second aperture to be incident on a third material layer positioned on a third surface of the support structure;
applying electrical potentials to a first screen surrounding the first layer, a second screen surrounding the second layer, and a third screen surrounding the third layer to permit secondary electrons generated in one of the first, second, and third layers to reach a detector, and to reduce a likelihood that secondary electrons generated in the other layers reach the detector;
detecting the secondary electrons that reach the detector; and
forming an image of the sample based on the detected secondary electrons.

21. The device of claim 1, further comprising a second plurality of conductive wires extending in a plane perpendicular to an average trajectory of the charged particles that pass through the aperture and strike the second layer so that the incident charged particles pass through the plane before reaching the first layer.

22. The device of claim 21, further comprising an electronic processor coupled to the member and the second plurality of wires, the electronic processor being configured to apply different electrical potentials to each of the member and the second pluralities of wires.

23. The device of claim 1, wherein the member comprises the conductive grid.

24. The device of claim 23, further comprising a plurality of conductive wires extending in a plane perpendicular to an average trajectory of the charged particles that pass through the aperture and strike the second layer so that the incident charged particles pass through the plane before reaching the first layer.

25. The device of claim 24, further comprising an electronic processor coupled to the member and the plurality of wires, the electronic processor being configured to apply different electrical potentials to each of the conductive grid and the plurality of wires.

26. The device of claim 1, wherein the member comprises the mesh comprising holes that allow secondary electrons to pass therethrough.

27. The device of claim 26, further comprising a plurality of conductive wires extending in a plane perpendicular to an average trajectory of the charged particles that pass through the aperture and strike the second layer so that the incident charged particles pass through the plane before reaching the first layer.

28. The device of claim 27, further comprising an electronic processor coupled to the member and the plurality of wires, the electronic processor being configured to apply different electrical potentials to each of the mesh and the plurality of wires.

29. A method, comprising:
- directing charged particles from a sample to be incident on a first material layer positioned on a first surface of a support structure and comprising a first aperture;
- directing transmitted charged particles that pass through the first aperture to be incident on a second material layer positioned on a second surface of the support structure;
- applying electrical potentials to a first screen surrounding the first layer, and a second screen surrounding the second layer to permit secondary electrons generated in one of the first and second layers to reach a detector, and to reduce a likelihood that secondary electrons generate d in the other layer reach the detector;
- detecting the secondary electrons that reach the detector; and
- forming an image of the sample based on the detected secondary electrons.

30. The method of claims 29, further comprising applying an electrical potential that is positive relative to an external ground to permit secondary electrons to reach the detector, and applying an electrical potential that is negative relative to the external ground to prevent secondary electrons from reaching the detector.

31. The method of claim 30, wherein a magnitude of the positive electrical potential is 500 V or less, and a magnitude of the negative electrical potential is 500 V or less.

32. The method of claims 31, further comprising applying an electrical potential that is positive relative to the external ground to the sample.

* * * * *

UNITED STATES PATENT AND TRADEMARK OFFICE
CERTIFICATE OF CORRECTION

PATENT NO. : 9,000,396 B2
APPLICATION NO. : 13/277658
DATED : April 7, 2015
INVENTOR(S) : Raymond Hill, Shawn McVey and John A. Notte, IV Page 1 of 1

It is certified that error appears in the above-identified patent and that said Letters Patent is hereby corrected as shown below:

In the Claims

Col. 26, line 1, Claim 19, delete "that" and insert -- than --.

Col. 27, line 12, Claim 29, delete "generate d" and insert -- generated --.

Signed and Sealed this
Eighth Day of September, 2015

Michelle K. Lee
*Director of the United States Patent and Trademark Office*